United States Patent [19]

Bonkohara et al.

[11] 4,138,691

[45] Feb. 6, 1979

[54] FRAMED LEAD ASSEMBLY FOR A SEMICONDUCTOR DEVICE COMPRISING INSULATOR REINFORCING STRIPS SUPPORTED BY A FRAME AND MADE INTEGRAL WITH LEAD STRIPS

[75] Inventors: Manabu Bonkohara; Hisao Kasuga, both of Tokyo, Japan

[73] Assignee: Nippon Electric Co., Ltd., Tokyo, Japan

[21] Appl. No.: 804,228

[22] Filed: Jun. 7, 1977

[51] Int. Cl.² ............... H01L 29/48; H01L 29/44; H01L 29/52

[52] U.S. Cl. ................. 357/70; 357/68; 357/72; 357/69; 357/80

[58] Field of Search ............... 357/68, 70, 72, 80, 357/69

[56] References Cited

U.S. PATENT DOCUMENTS

| | | | |
|---|---|---|---|
| 3,192,307 | 6/1965 | Lazar | 357/72 |
| 3,450,956 | 6/1969 | Bauer et al. | 357/70 |
| 3,544,857 | 12/1970 | Byrne et al. | 357/72 |
| 3,751,724 | 8/1973 | McGrath et al. | 357/72 |
| 3,942,245 | 3/1976 | Jackson et al. | 357/70 |
| 3,975,757 | 8/1976 | Sporck | 357/70 |
| 4,063,993 | 12/1977 | Burns | 357/70 |

Primary Examiner—Andrew J. James
Attorney, Agent, or Firm—Hopgood, Calimafde, Kalil, Blaustein & Lieberman

[57] ABSTRACT

In a framed lead assembly for a semiconductor element, conductive lead strips comprising inward end portions for connection to electrode areas of the semiconductor element are supported to a frame by reinforcing strips of an insulating material made integral with at least center portions of the respective lead strips and a connection arrangement connecting the reinforcing strips with the frame. The connection arrangement may comprise those outward end regions of the respective reinforcing strips which are made integral with the frame of the insulating material and those outward end areas of the respective lead strips which are attached to the frame. The reinforcing strips may be connected together by bridge members of either the insulating material or another insulating material. Alternatively, the connection arrangement may comprise bridge members connecting the reinforcing strips together and supporting members connecting the bridge members with the frame with outward end portions of the lead strips either separated from the frame or having outward end areas extended further outwardly of the respective outward end portions and attached to the frame. Preferably, the frame and the bridge and supporting members are of the insulating material and made integral with one another with the outward end portions being not made integral with the reinforcing strips. Also preferably, the inward end portions are not made integral with the reinforcing strips in whichever structure of the connection arrangement.

14 Claims, 12 Drawing Figures

FRAMED LEAD ASSEMBLY FOR A SEMICONDUCTOR DEVICE COMPRISING INSULATOR REINFORCING STRIPS SUPPORTED BY A FRAME AND MADE INTEGRAL WITH LEAD STRIPS

BACKGROUND OF THE INVENTION

This invention relates to a framed lead assembly for use in manufacturing a semiconductor device.

A semiconductor device comprises a semiconductor element comprising, in turn, a semiconductor chip and at least one circuit element on the chip. The circuit element has a plurality of electrode areas. The semiconductor device may be a transistor, an integrated circuit, or the like. In a sophisticated semiconductor device, the electrode areas are individually wire-bonded to outer leads.

As will be described in the following with reference to a few figures of the accompanying drawing, a framed lead assembly disclosed in Japanese Patent Publication No. Syô 46-37,929 (1971) or another framed lead assembly revealed in Japanse Patent Publication No. Syô 44-13,663 (1969) or 47-3,206 (1972) comprises a plurality of conductive lead strips capable of being simultaneously electrically connected to the electrode areas. It has, however, been difficult to keep the lead strips in exact positions.

As will be described also later with reference to one figure of the accompanying drawing, still another framed lead assembly disclosed in U.S. Pat. No. 3,440,027 comprises an insulator sheet for keeping the lead strips in exact positions. It has, however, been hardly readily feasible with the lead assembly to attain exact registration of the lead strips with the electrode areas. In addition, the lead assembly is often inconvenient when it is desired to further electrically connect the lead strips to outer leads.

SUMMARY OF THE INVENTION

It is therefore a general object of the present invention to provide a framed lead assembly for use in combination with a semiconductor element to manufacture a semiconductor device, which lead assembly comprises conductive lead strips kept in exact positions and yet makes it possible to readily achieve exact registration of the lead strips with electrode areas of the semiconductor element.

It is an additional object of this invention to provide a framed lead assembly of the type described, with which it is convenient to connect the lead strips to outer leads.

It is a further additional object of this invention to provide a framed lead assembly of the type described, with which it is readily possible to insure electric connection between the lead strips and the electrode areas and/or the outer leads.

It is possible to deem a framed lead assembly according to this invention to be a result of an improvement in a conventional one that is for use in manufacturing a semiconductor device and is described in the above-referenced United States Patent. The semiconductor device comprises a semiconductor element having a plurality of electrode areas. The conventional framed lead assembly comprises a plurality of lead strips of an electrically conductive material and means for supporting the lead strips in generally radially extended positions. The lead strips comprise radially inward end portions, respectively, for connection to the electrode areas. In accordance with this invention, the above-mentioned means comprises a frame member having an inside edge generally defining an opening for receiving the semiconductor element, a plurality of reinforcing strips of an electrically insulating material rendered integral with at least predetermined portions of the lead strips, respectively, and connection means connecting the reinforcing strips with the frame member to support the lead strips in the above-described positions. It is to be noted here that the reinforcing strips substantially conform in shape and dimensions with those areas of the lead strips with which the reinforcing strips are rendered integral.

Figure 1:
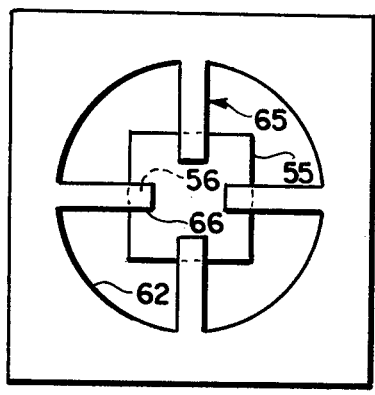
FIG. 1 is a schematic top view of a conventional framed lead assembly.

DESCRIPTION OF THE PREFERRED EMBODIMENTS:

Referring to FIG. 1, a conventional framed lead assembly for use in manufacturing a semiconductor device will be described at first for a better understanding of the present invention. The semiconductor device comprises a semiconductor element 55, which is usually of a rectangular or a square shape whose side is from one to several millimeters long. For simplicity of illustration, it is presumed that the semiconductor element 55 has four electrode areas 56. Usually, each electrode area 56 is of a square shape whose side is from 100 to 150 microns long. Each electrode area 56 is spaced from a next adjacent one by a spacing of from 100 to 200 microns. The lead assembly comprises an aluminium frame 61 having an inside edge 62 that generally defines an opening for receiving the semiconductor element 55. It will be seen that the opening is substantially circular in the illustrated example. A plurality of aluminium lead strips 65 are extened radially inwardly from the inside edge 62 into the opening. Depending on the dimensions of the semiconductor element 55, the opening has a diameter of from 10 to 20 mm. Consequently, the lead strips 65 are from 5 to 10 mm long and comprise radially inward end portions 66, respectively, for connection to the electrode areas 56. The frame 61 and the lead strips 65 are manufactured as an integral assembly either by mechanically punching or chemically etching an aluminium foil. On manufacturing the semiconductor device, the inward end portions 66 are brought into exact registration with the electrode areas 56 and press-connected to the latter.

Inasmuch as the electrode areas 56 are highly precisely formed, it is necessary that the lead strips 65 have precise dimensions and are exactly situated relative to each other. In order to manufacture the lead strips 65 with sufficient precision, use of a thin foil is desirable. Too thin a foil, however, adversely affects the mechanical strength of the lead strips 65. The thickness of the foil has to be about 35 microns or more and usually about 50 microns. Even with these thicknesses, deformation often occurs in the lead strips 65 during manufacture of the lead assembly and/or during connection of the outward end portions 66 to the electrode areas 56. In addition, it is impossible to test the electric characteristics of the semiconductor device before the lead strips 65 are cut from the frame 61 into separate leads of the semiconductor device.

Figure 2:
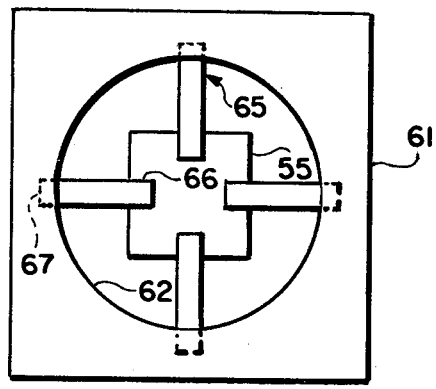
FIG. 2 is a similar view of another conventional framed lead assembly.

Referring to FIG. 2, another conventional framed lead assembly comprises a polyimide frame 61 and a plurality of copper lead strips 65 having radially outward end areas 67, respectively, that are attached to the frame 61. Even with as thin a thickness as about 100 microns, the frame 61 is sufficiently mechanically strong. The thickness of the copper lead strips 65 is similar to that of the aluminium lead strips described with reference to FIG. 1. On manufacturing the lead assembly, a polyimide sheet is punched or otherwise shaped into polyimide frames, such as 61. A copper foil is press-attached to the frame 61 with an intermediary of a polyamide adhesive and with the temperature raised. Thereafter, the copper foil is subjected to the known photoresist and etching processes to become the lead strips 65. Although test of the electric characteristics is possible with the frame 61 left unseparated, the copper lead strips 65 are again liable to deform.

Figure 3:
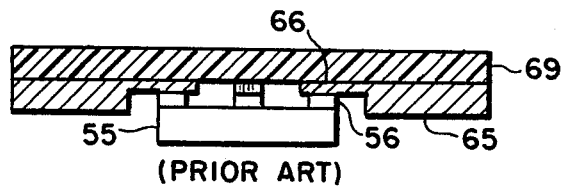
FIG. 3 is a like view of still another conventional framed lead assembly.

Referring to FIG. 3, still another conventional framed lead assembly comprises a plurality of copper lead strips 65 and a thin sheet 69 of an electrically insulating material, such as a polyester resin, for supporting the lead strips 65 in exact positions. The insulator sheet 69 is again about 100 microns thick. On manufacturing the lead assembly, a copper foil is heat-pressed to the polyester sheet 69 and subjected to the photoresist and etching techniques. The insulator sheet 69 entirely covers one of a pair of principal surfaces of each lead strip 65. Although effective in reinforcing the lead strips 65, this is inconvenient when it is desired to electrically connect the covered principal surface of the lead strip 65 to an outer lead. Furthermore, this makes it difficult to attain exact registration of the outward end portions 66 with the electrode areas 56 on manufacturing a semiconductor device.

Figure 4:
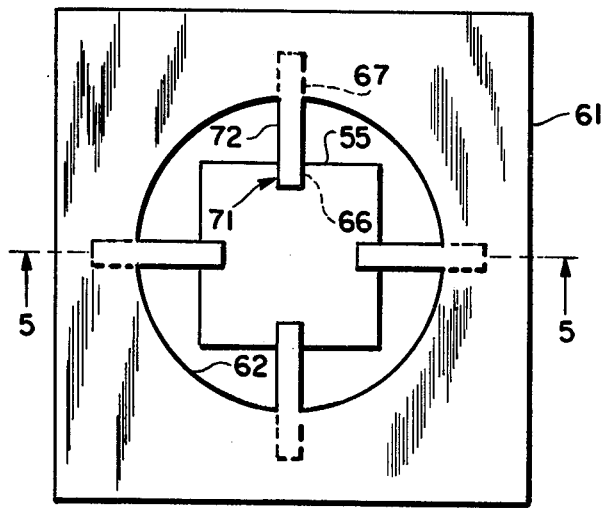
FIG. 4 is a schematic top view of a framed lead assembly according to a first embodiment of the present invention.
Figure 5:
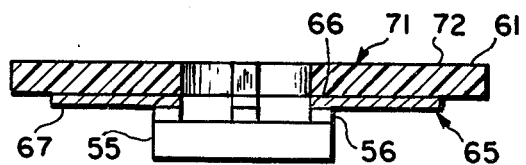
FIG. 5 is a schematic cross-sectional view taken on a plane indicated in FIG. 4 by a line 5—5.

Referring now to FIGS. 4 and 5, a framed lead assembly according to a first embodiment of the present invention comprises a polyimide frame 61 having an inside edge 62 that generally defines an opening for receiving the semiconductor element 55. The lead assembly further comprises a plurality of conductive lead strips 65 that are supported by the frame 61 in generally radially extended positions in a manner described in the following. The lead strips 65 comprise radially inward end portions 66, respectively, for connection to the electrode areas 56 and have radially outward end areas 67 attached to the frame 61. The lead assembly still further comprises a plurality of polyimide reinforcing strips 71 extended integrally from the frame 61 radially inwardly along the respective lead strips 65 and made integral at least with predetermined portions of the respective lead strips 65. The reinforcing strips 71 substantially two-dimensionally conform in shape and dimensions with those areas of the lead strips 65 with which the reinforcing strips 71 are rendered integral. It will be understood that those radially outward end regions 72 of the respective reinforcing strips 71 which are extended as integral extensions of the frame 61 serve to connect the remaining regions of the reinforcing strips 71 with the frame 61 and thereby to place the lead strips 65 in exact positions in cooperation with the remaining regions. It will also be understood that the outward end areas 67 additionally serve to connect the reinforcing strips 71 with the frame 61.

Further referring to FIGS. 4 and 5, the frame 61 having the integral reinforcing strips 71 is most preferably shaped by subjecting a thin insulator sheet of a thickness of about 100 microns to the known photoresist and etching techniques. Etching of a polyimide sheet is preferably carried out by the use as the etchant of hydrazine at a slightly raised temperature between about 50° and 80° C. The lead strips 65 are formed by attaching an aluminium, a copper, or a like metal foil of a thickness between several microns and several dozens of microns to the shaped insulator sheet by the known heat-press technique and subjecting the metal foil to the known photoresist and etching processes. It is possible to attach the metal foil to an unshaped insulator sheet rather than to each shaped insulator sheet and to form the lead strips 65 simultaneously for a plurality of framed lead assemblies, followed by shaping of the insulator sheet into separate shaped sheets to provide individual framed lead assemblies. Preferably, the heat-press technique is carried out by the use of a polyamide, an epoxy resin, or a similar adhesive at a temperature between about 100° and 200° C. and under a pressure between about 0.5 and several kg/cm². Alternatively, the lead strips 65 are formed by printing or otherwise applying conductive paste, such as silver or gold paste, onto the shaped insulator sheet and firing the paste preferably at a temperature between about 200° and 300° C. Irrespective of the methods of manufacture, the lead strips 65 are astonishingly kept in exact positions. Moreover, the inward end portions 66 are readily visible together with the electrode areas 56 on achieving exact registration of the former relative to the latter.

Figure 6:
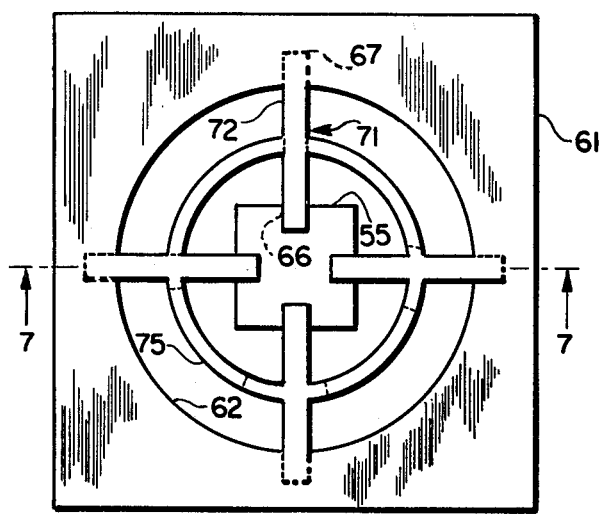
FIG. 6 is a schematic top view of a framed lead assembly according to a second embodiment of this invention.
Figure 7:
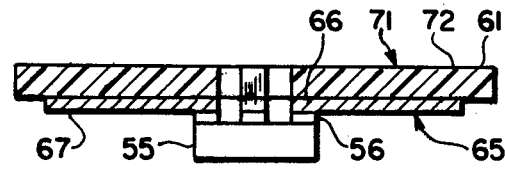
FIG. 7 is a schematic cross-sectional view taken on a plane indicated in FIG. 6 by a line 7—7.

Turning to FIGS. 6 and 7, a framed lead assembly according to a second embodiment of this invention comprises similar parts designated by like reference numerals as in FIGS. 2, 4, and 5. The lead assembly further comprises a plurality of insulator bridge members 75 connecting the reinforcing strips 65 with one another. In the illustrated example, the bridge members 75 form a substantially annular ring member that intersects the reinforcing strips 71 in an inwardly concentric relation to the inside edge 62 and generally defines in the opening an inner opening for receiving the semiconductor element 55. The bridge members 75 have no conductive films or layers thereon. It is readily possible to form the bridge members 75 out of the insulator sheet together with the frame 61 and the reinforcing strips 71 by resorting to the photoresist and etching techniques. Alternatively, the bridge members 75 are preliminarily punched from or otherwise made of a sheet of another electrically insulating material, such as a polyester resin for the frame 61 and the reinforcing strips 71 of polyimide, and of a thickness between about 20 and 100 microns and are heat-pressed to the reinforcing strips 71. The hot press is preferably carried out by the use of a polyester-resin or a like adhesive at a temperature between about 80° and 120° C. and under a pressure between about 0.5 and several kg/cm². As the case may be, use is possible of only a single bridge member 75 connecting a predetermined one of the reinforcing strips 71 with a next adjacent one particularly when the predetermined reinforcing strip is long extended from the inside edge 62. The ring member, as called herein, may not necessarily be of a regular shape but may comprise one of the bridge members 75 radially outwardly or inwardly offset relative to an azimuthally next adjacent one.

Figure 8:
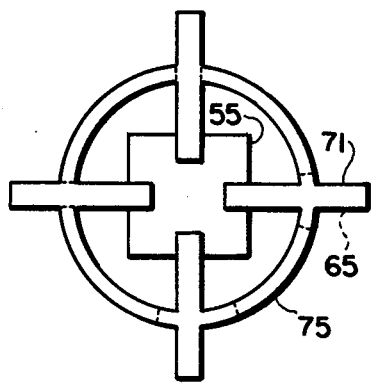
FIG. 8 is a schematic top view of a semiconductor device comprising a lead assembly made from the framed lead assembly illustrated in FIGS. 4 and 5.
Figure 9:
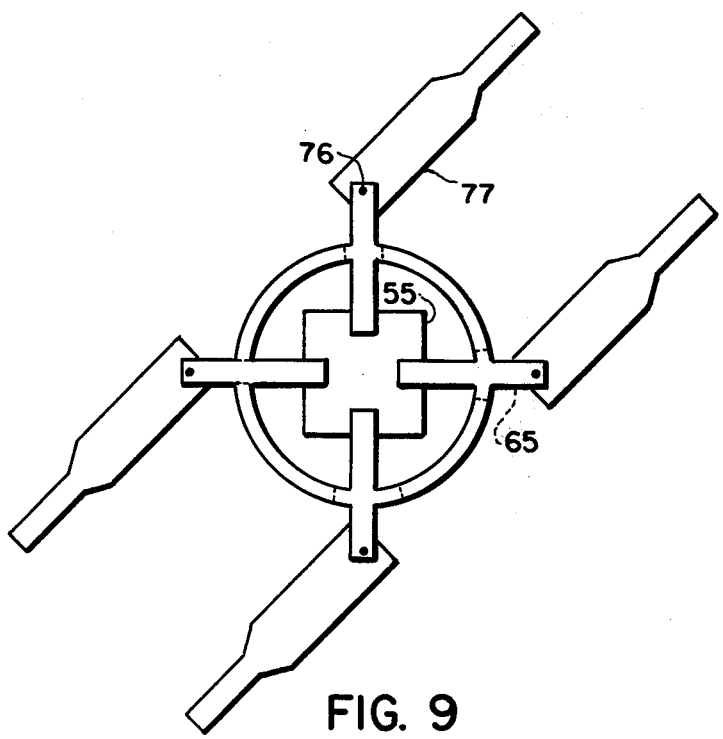
FIG. 9 is a similar view of the semiconductor device depicted in FIG. 8, with outer leads attached thereto.

Referring to FIGS. 8 and 9, the reinforcing strips 71 are cut from the frame 61 together with the lead strips 65 after the inward end portions 66 are press-connected to the electrode areas 56 (not indicated herein) to thereby provide a semiconductor device. In FIG. 9, the lead strips 65 of the semiconductor device depicted in FIG. 8 are heat-pressed at points 76 to a like number of metal leads 77, respectively. The metal leads 77 are preferably made of a nickel-cobalt-iron alloy known as Kovar and plated with tin. It is now possible to make further electric connection to whichever surface of each metal lead 77.

Figure 10:
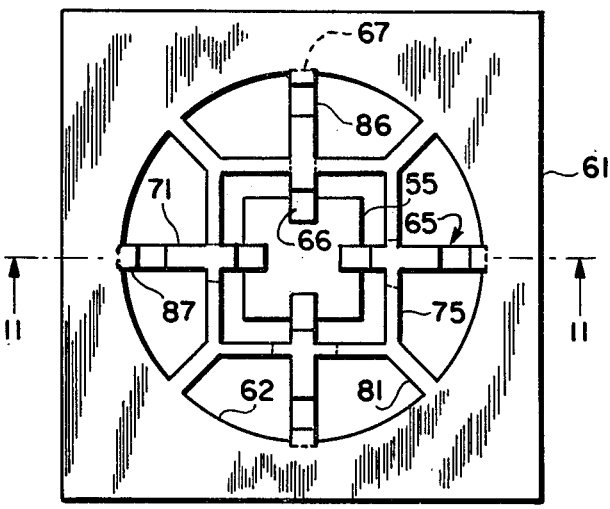
FIG. 10 is a schematic top view of a framed lead assembly according to a third embodiment of this invention.
Figure 11:
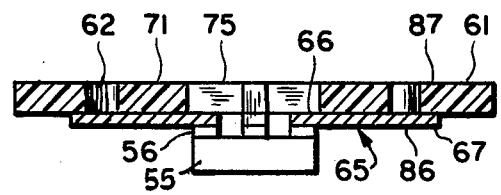
FIG. 11 is a schematic cross-sectional view taken on a plane indicated in FIG. 10 by a line 11—11.

Turning to FIGS. 10 and 11, a framed lead assembly according to a third embodiment of this invention again comprises similar parts designated by like reference numerals as in FIGS. 4, 5, 8, and 9. The reinforcing strips 71, however, are not directly connected with the frame 61 but indirectly through the above-described bridge members 75, equal in number to the reinforcing strips 71, and a plurality of supporting members 81. The bridge members 75 are disposed between the respective reinforcing strips 71 to form a substantially square ring member that intersects the reinforcing strips 71 in the opening and generally defines in the opening an inner opening for receiving the semiconductor element 55. The supporting members 81 connect the ring member with the frame 61 at positions offset relative to the reinforcing strips 71. Insofar as the spacing between two next adjacent ones of the lead strips 65 admits at the radial position of the ring member and radially outwardly thereof, each of the supporting members 81 is preferably disposed between two next adjacent ones of the reinforcing strips 71. Use may be made of one or more additional bridge members, similar to those shown at 75, that may or may not be connected with the frame 61 through one or more of the supporting members 81. By this arrangement, it is possible to provide the lead strips 71 with radially outward end portions 86 that are not made integral with the reinforcing strips 71. This enables an outer lead, such as the above-described metal lead 77, to be connected to whichever principal surface of each lead strip 65 and the press-connection operation to be carried out without the intervening insulator reinforcing strips 71 to insure the electric connection. In the illustrated example, also the inward end portions 66 are not rendered integral with the reinforcing strips 71. This facilitates and insures the electric connection of the inward end portions 66 with the electrode areas 56.

Referring more particularly to FIGS. 10 and 11, connection of the reinforcing strips 71 to the frame 61 is augmented by the afore-mentioned outer end areas 67 that are further radially outwardly contiguous to the outward end portions 86 and are attached to the frame 61. In the illustrated example, protrusions 87 of the frame 61 are integrally extended therefrom radially slightly inwardly along the respective lead strips 65 and are made integral with the outward end areas 67. The outward end areas 67 may be more radially outwardly extended and attached to the frame in the manner exemplified in FIGS. 4, 5, 8, and 9. In either event, it is possible to say that the protrusions 87 are rendered integral with those domains of the outward end portions 86 which are adjacent to the edge 62. When made of the same insulating material, the frame 61 with or without protrusions 87, the reinforcing strips 71, the bridge members 75, and the supporting members 81 are readily shaped as an integral assembly from an insulator sheet by the photoresist and etching processes. Preferably, the insulator sheet is processed after formation of the lead strips 65 specifically when the lead strips 65 comprise the inward and outward end portions 66 and 86 that are not made integral with the reinforcing strips 71.

Figure 12:
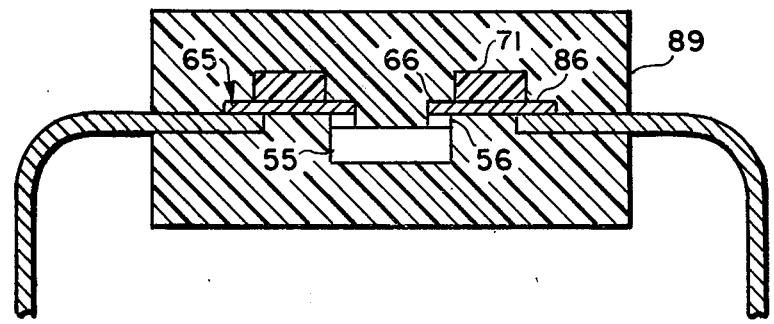
FIG. 12 is a schematic cross-sectional view of a semiconductor device comprising a lead assembly made from the framed lead assembly illustrated in FIGS. 10 and 11.

Finally referring to FIG. 12, the lead strips 65 are cut along or near radially outermost lines of the uncovered outward end portions 86 after the semiconductor element 55 is attached to the framed lead assembly. The lead strips 65 of a semiconductor device thereby provided are press-connected to outer leads 77. Subsequently, the semiconductor device and inside end portions of the outer leads 77 are sealed in a mass 89 of an epoxy resin.

While a few preferred embodiments of the present invention and several modifications thereof have thus far been described, it should clearly be understood that other embodiments and modifications are possible within the scope of this invention. For example, it is possible to make the frame 61 of an electrically conductive material rather than of an electrically insulating material, such as polyimide or a polyester, a polypropylene, or a polyvinyl resin. For a framed lead assembly according to the third embodiment, it is also possible to make the bridge members 75 and/or the supporting members 81 of the same or a different conductive material. When the frame 61 is of a conductive material in the lead assembly according to the third embodiment, it is preferred for the test of electric characteristics that the lead strips 65 are not provided with the outer end areas 67 attached to the conductive frame 61 and comprise outward end portions 86 that are merely radially outwardly extended towards the inside edge 62. Although preferably disposed substantially on a single plane, the supporting members 81 may be three-dimensionally offset relative to the reinforcing strips 71. It is possible to provide a framed lead assembly with leads trips 65 exceeding in number the electrode areas 56. The opening may be elliptic or rectangular.

What is claimed is:

1. In a framed lead assembly for use in manufacturing a semiconductor device, said semiconductor device comprising a semiconductor element having a plurality of electrode areas, said lead assembly comprisng a plurality of lead strips of an electrically conductive material and means for supporting said lead strips in generally radially extended positions, said lead strips comprising radially inward end portions, respectively, for connection to said electrode areas, the improvement wherein said means comprises a frame member having an inside edge generally defining an opening for receiving said semiconductor element, a plurality of reinforcing strips of an electrically insulating material rendered integral with at least predetermined portions of said lead strips, respectively, and connection means connecting said reinforcing strips with said frame member to support said lead strips in said positions, said reinforcing strips substantially conforming in shape and dimensions with those areas of said lead strips with which said reinforcing strips are rendered integral.

2. A framed lead assembly as claimed in claim 1, wherein said frame member is of said electrically insulating material, said connection means comprising radially outward end regions of said reinforcing strips and radially outward end areas of said lead strips, said predetermined portions comprising radially outward end portions of said lead strips, respectively, said outward end areas being radially outwardly contiguous to said outward end portions, respectively, and attached to said insulator frame member, said outward end regions being rendered integral with said insulator frame member at said inside edge.

3. A framed lead assembly as claimed in claim 2, wherein said connection means further comprises a bridge member connecting a predetermined one of said reinforcing strips with a next adjacent one of said reinforcing strips.

4. A framed lead assembly as claimed in claim 3, wherein the bridge members form a substantial ring member intersecting said reinforcing strips in said opening and generally defining in said opening an inner opening for receiving said semiconductor element.

5. A framed lead assembly as claimed in claim 4, wherein said inward end portions are not rendered integral with said reinforcing strips.

6. A framed lead assembly as claimed in claim 5, wherein said bridge members are of said insulating material and are rendered integral with said reinforcing strips at respective points of intersection of said ring member with said reinforcing strips.

7. A framed lead assembly as claimed in claim 5, wherein said bridge members are of another electrically insulating material and are attached to said reinforcing strips.

8. A framed lead assembly as claimed in claim 1, wherein said connection means comprises bridge members, at least equal in number to said reinforcing strips, and a plurality of supporting members, said bridge members connecting the respective ones of said reinforcing strips with those of said reinforcing strips which are next adjacent to said respective reinforcing strips and forming a substantial ring member that intersects said reinforcing strips in said opening and generally defines in said opening an inner opening for receiving said semiconductor element, said supporting members connecting said ring member with said frame member at positions offset relative to said reinforcing strips.

9. A framed lead assembly as claimed in claim 8, wherein each of said supporting members is disposed between two next adjacent ones of said reinforcing strips.

10. A framed lead assembly as claimed in claim 8, wherein said inward end portions are not rendered integral with said reinforcing strips.

11. A framed lead assembly as claimed in claim 10, wherein said lead strips further comprise radially outward end portions, respectively, that are radially outwardly extended towards said inside edge and are not rendered integral with said reinforcing strips.

12. A framed lead assembly as claimed in claim 10, wherein said frame member, said bridge members, and said supporting members are of said electrically insulating material and are rendered integral with one another at said inside edge and at respective points of intersectin of said ring member with said reinforcing strips.

13. A framed lead assembly as claimed in claim 12, wherein said connection means further comprises those radially outward end areas of said lead strips which are attached to said insulator frame member, said lead strips further comprising radially outward end portions that are radially inwardly contiguous to said outward end areas, respectively, and are not rendered integral with said reinforcing strips.

14. A framed lead assembly as claimed in claim 13, wherein said lead strip supporting means further comprises those protrusions of said insulator frame member which are radially inwardly projected from said inside edge along said lead strips, respectively, and are rendered integral with those domains of said outward end portions which are adjacent to said inside edge.

* * * * *